United States Patent [19]

Ouchi et al.

[11] 3,779,925

[45] Dec. 18, 1973

[54] PIEZOELECTRIC CERAMIC COMPOSITIONS

[75] Inventors: Hiromu Ouchi; Masamitusu Nishida; Katsuo Nagano, all of Osaka, Japan

[73] Assignee: Matsushita Electric Industrial Co., Ltd., Kadoma, Osaka, Japan

[22] Filed: Oct. 8, 1971

[21] Appl. No.: 187,850

[52] U.S. Cl. .............................................. 252/62.9

[51] Int. Cl. ...................... C04b 35/46, C04b 35/48

[58] Field of Search .................. 252/62.9; 106/39 R

[56] References Cited

UNITED STATES PATENTS

| | | | |
|---|---|---|---|
| 3,649,539 | 3/1972 | Nishida et al. | 252/62.9 |
| 3,544,469 | 12/1970 | Watamabe et al. | 252/62.9 |
| 3,595,795 | 7/1971 | Tsubouchi et al. | 252/62.9 |
| 3,484,377 | 12/1969 | Tsubouchi et al. | 252/62.9 |

*Primary Examiner*—Oscar R. Vertiz
*Assistant Examiner*—J. Cooper
*Attorney*—E. F. Wenderoth et al.

[57] ABSTRACT

Piezoelectric ceramic compositions having high mechanical strength, high electrical breakdown strength, high coercive force, high electromechanical coupling coefficient and high mechanical quality factor, and comprising the solid solution in the system $PbO$—54.8–50.1 mol %
$MnO_2$—9.3–0.2 mol %
$Nb_2O_5$—7.3–0.2 mol %
$Li_2O$—3.8–0.1 mol %
$TiO_2$—24.8–14.8 mol %
$ZrO_2$—26.8–14.8 mol % and $Nb_2O_5/Li_2O$ mol ratio is a value selected from the range $4.0000 \geqq Nb_2O_5/Li_2O \geqq 3.1428$ and $2.8636 \geqq$ 24 $Nb_2O_5/Li_2O \geqq 1.8421$.

11 Claims, No Drawings

PIEZOELECTRIC CERAMIC COMPOSITIONS

This invention relates to piezoelectric ceramic compositions and articles of manufacture fabricated therefrom. More particularly, the invention pertains to novel and improved ferroelectric ceramics which are polycrystalline aggregates of particular constituents. These piezoelectric compositions are sintered to ceramics by ordinary ceramic techniques and thereafter the ceramics are polarized by applying a D-C voltage between the electrodes to impart thereto electromechanical transducing properties similar to the well-known piezoelectric effect. The invention also encompasses the calcined product of raw ingredients and the articles of manufacture such as electromechanical transducers fabricated from the sintered ceramic.

The ceramic bodies materialized by the present invention exist basically in the solid solution comprising the system $PbO—MnO_2—Nb_2O_5—Li_2O—TiO_2—ZrO_2$, in solid solution form, wherein $PbO$ — 55.0–50.1 mol %
$MnO_2$ — 9.3–0.2 mol %
$Nb_2O_5$ — 7.3–0.2 mol %
$Li_2O$ — 3.8–0.1 mol %
$TiO_2$ — 24.8–14.8 mol %
$ZrO_2$ — 26.8–14.8 mol % and $Nb_2O_5/Li_2O$ mol ratio is a value selected from the range $4.0000 \geqq Nb_2O_5/Li_2O \geqq 3.1428$ and $2.8636 \geqq Nb_2O_5/Li_2O \geqq 1.8421$.

The use of piezoelectric materials in various transducer applications in the production, measurement and sensing of sound, shock, vibration, pressure, etc., has increased greatly in recent years. Both crystal and ceramic types of transducers have been widely used. But, because of their potentially lower cost and facility in the fabrication of ceramics with various shapes and sizes and their greater durability for high temperature and/or for humidity than that of crystalline substances such as Rochelle salt, piezoelectric ceramic materials have recently achieved importance in various transducer applications.

The piezoelectric characteristics of ceramics required apparently vary with species of applications. For example, electromechanical transducers such as phonograph pick-ups, microphones and voltage generators in ignition systems require piezoelectric ceramics characterized by a substantially high electromechanical coupling coefficient, dielectric constant and high mechanical and electrical strength. On the other hand, it is desired in filter applications of piezoelectric ceramics that the materials exhibit a high stability with temperature and time in resonant frequency and in other electrical properties.

As more promising ceramics for these requirements, lead titanate-lead zirconate is in wide use up to now and their properties are disclosed in U.S. Pat. Nos. 2,708,244 and 2,849,404. However, it is difficult to get high mechanical and electrical breakdown strength, high coercive force, high mechanical quality factor along with high planar coupling coefficient and temperature stability in resonant frequency in the lead titanate-lead zirconate ceramics in the application to piezoelectric ceramic transformer for high voltage generation of a television receiver. And the dielectric and piezoelectric properties of the lead titanate-lead zirconate ceramics change greatly with firing technique which is ascribable to evaporation of PbO.

SUMMARY OF THE INVENTION

It is, therefore, the fundamental object of the present invention to provide novel and improved piezoelectric ceramic materials which overcome the problems outlined above.

A more specific object of the invention is to provide improved polycrystalline ceramics characterized by very high mechanical and electrical breakdown strength, high coercive force, high mechanical quality factor along with high planar coupling coefficient and temperature stability in resonant frequency.

Another object of the invention is the provosion of novel piezoelectric ceramic composition, certain properties of which can be adjusted to suit various applications.

Still another object of the invention is the provision of improved electromechanical transducer utilizing, as the active elements, an electrostatically polarized body of the novel ceramic compositions.

These objects are achieved by providing ceramic bodies which exist basically in the solid solution comprising the system $PbO$(55.0 to 50.1 mol percent)—$MnO_2$ (9.3 to 0.2 mol percent)—$Nb_2O_5$ (7.3 to 0.2 mol percent)—$Li_2O$ (3.8 to 0.1 mol percent)—$ZrO_2$ (26.8 to 14.8 mol percent)—$TiO_2$ (24.8 to 14.8 mol percent) and $Nb_2O_5/Li_2O$ mol ratio is a value selected from the range $4.0000 \geqq Nb_2O_5/Li_2O \geqq 3.1428$ and $2.8636 \geqq Nb_2O_5/Li_2O \geqq 1.8421$.

DETAILED DESCRIPTION OF THE INVENTION

The present invention is based on the discovery that within certain particular compositional ranges of the system $PbO—MnO_2—Nb_2O_5—Li_2O—TiO_2—ZrO_2$ the specimens exhibit very high mechanical bending strength, high electrical breakdown strength, high coercive force, high mechanical quality factor along with high planar coupling coefficient and high stability in resonant frequency with temperature.

The present invention has various advantages in manufacturing process and in application for transducers, especially piezoelectric ceramic transformer for high voltage supply to a television receiver. It has been known that the evaporation of PbO during firing is a problem in sintering of lead compounds such as lead titanate zirconate. The composition of the invention evidence a smaller amount of evaporated PbO than the lead titanate-lead zirconate ceramics upon firing. The invented composition can be fired in the absence of any particular control of PbO atmosphere. A well sintered body of the present composition is obtained by firing in a ceramic sagger with a ceramic cover made of $Al_2O_3$ ceramic. A high sintered density is desirable for humidity resistance and high piezoelectric response when the sintered body is utilized as a electromechanical transducer and for other application.

All possible compositions coming within the system are represented by the mol percent of each oxide component of the system $PbO—MnO_2—Nb_2O_5—Li_2O—TiO_2—ZrO_2$. Some compositions represented by the system $PbO—MnO_2—Nb_2O_5—Li_2O—TiO_2—ZrO_2$, however, do not exhibit high piezoelectricity, and many are electromechanically active only to a slight degree. The present invention is concerned only with those basic compositions exhibiting piezoelectric response of appreciable magnitude. As a matter of convenience, the planar coupling coefficient ($K_p$) of test discs will be taken as a measure of piezoelectric activity. Thus, all compositions polarized and tested which represented by the system $u$ PbO-$v$ $MnO_2$—$w$ $Nb_2O_5$-$x$ $Li_2O$-$y$ $TiO_2$-$z$ $ZrO_2$, wherein $u,v,w,x,y$ and $z$ respectively had a following mol percent, $u$=55.0 to 50.1, $v$=9.3 to 0.2, $w$=7.3 to 0.2, $x$=3.8 to 0.1, $y$=24.8 to 14.8, $z$=26.8 to 14.8, and $u+v+w+x+y+z=100$, showed a planar coupling coefficient of approximately 0.4 or higher, mechanical quality factor of approximately 2,070 or higher, mechanical bending strength approximately 1,320 kg/cm$^2$ or higher, electrical breakdown voltage of approximately 19.4 kV/mm or higher, coercive force of approximately 19.8 kV/cm or higher, and high temperature stability in resonant frequency smaller than ±0.25 percent in the range of −20°C to 70°C.

According to the present invention, piezoelectric and dielectric properties of the ceramics can be adjusted to suit various applications by selecting the proper composition. However, the compositions out of said mol percent showed a poor characteristic value in the one property of among these characteristic features.

The compositions described herein may be prepared in accordance with well known ceramic procedures. An advantageous method, however, hereinafter more fully described, consist in the use of PbO or $Pb_3O_4$, $MnO_2$or MnO, $Nb_2O_5$, $Li_2CO_3$or LiOH, $TiO_2$ and $ZrO_2$ as starting materials.

EXAMPLE

The starting materials, viz., lead oxide (PbO), manganese dioxide ($MnO_2$), niobia ($Nb_2O_5$), lithium carbonate ($Li_2CO_3$), titania ($TiO_2$) and zirconia ($ZrO_2$), all of relatively pure grade (e.g., C.P. grade) are intimately mixed in a rubber-lined ball mill with distilled water. In milling the mixture, care should be exercised to avoid contamination thereof due to wear of the milling ball or stones. This may be avoided by varying the proportions of the starting materials to compensate for any contamination.

Following the wet milling, the mixture is dried and mixed to insure as homogeneous a mixture as possible. Thereafter, the samples for which data are given hereinbelow were prepared by mixing 100 grams of the milled mixture with 5 cc of binder solution such as poly vinyl alcohol solution and granulating. The mix was then pressed into discs of 20 mm diameter and 2 mm thickness at a pressure of 700 kg/cm$^2$. The pressed discs were fires at 1,200°–1,300°C for 60 minutes of heating period. According to the present invention, there is no need to fire the composition in an atmosphere of PbO. Moreover, there is no need to maintain a special temperature gradient in the firing furnace as is necessary in prior art procedures. Thus, according to the present invention, uniform and excellent piezoelectric ceramic bodies can be easily obtained simply by covering the samples with an alumina sagger during firing.

The sintered ceramics were polished on both surfaces to the thickness of 1 millimeter. The polished disc surfaces were then coated with silver paint and fired to form silver electrodes. Finally, the disc were polarized while immersed in a bath of silicone oil at 100°C. A voltage gradient of D-C 4.5 kV per mm was maintained for 1 hour, and the discs field-cooled to room temperature in 30 minutes.

The piezoelectric and dielectric properties of the polarized specimen were measured at 25°C in a relative humidity of 50 percent and at a frequency of 1 kHz. Examples of specific ceramic compositions according to this invention and various pertinent electromechanical planar coupling coefficient, mechanical quality factor, mechanical bending strength, electrical breakdown strength and coercive force thereof are given in Table 1. As the comparative example, Table 2 shows the exemplary piezoelectric ceramic compositions selected from out of the scope of the system according to the present invention.

From Table 1, it will be readily evident that all exemplary compositions selected from the system $u$ PbO-$v$ $MnO_2$i w $Nb_2O_5$-$x$ $Li_2O$-$y$ $TiO_2$-$z$ $ZrO_2$, wherein subscripts $u,v,w,x,y$ and $z$ respectively had a following mol percent, $u$+55.0 to 50.1, $v$=9.3 to 0.2, $w$=7.3 to 0.2, $x$ =3.8 to 0.1, $y$=24.8 to 14.8, $z$=26.8 to 14.8, and $u+v+w+x+y+z=100$ and $Nb_2O_5/Li_2O$ mol ratio is a value selected from the range $4.0000 \geqq Nb_2O_5/Li_2O \geqq 3.1428$ and $2.8636 \geqq Nb_2O_5/Li_2O \geqq 1.8421$, are characterized by very high mechanical bending strength, high electrical breakdown strength, high coercive force, high mechanical quality factor ($Q_M$) along with high planar coupling coefficient ($k_p$) and high stability in resonant frequency over a temperature range of −20° to 70° C. All of which properties are important for the use of piezoelectric compositions in piezoelectric transformer, ceramic resonator and oscillator element, ceramic ignitor element applied as park source for gas, and ultra-sonic transducer applications. From the comparison between Table 1 and Table 2, it will be obvious that the compositions within the range of the system $u$ PbO-$v$ $MnO_2$-$w$ $Nb_2O_5$- $x$ $Li_2O$-$y$ $TiO_2$-$z$ $ZrO_2$, wherein $u$=55.0 to 50.1, $v$=9.3 to 0.2, $w$= 7.3 to 0.2, $x$=3.8 to 0.1, $y$=24.8 to 14.8, $z$=26.8 to 14.8, and $u+v+w+x+y+z=100$ mol percent and $Nb_2O_5/Li_2O$ mol ratio is a value selected from the range $4.0000 \geqq Nb_2O_5/Li_2O \geqq 3.1428$ and $2.8636 \geqq Nb_2O_5/Li_2O \geqq 1.8421$, exhibit a marked improvement in mechanical bending strength, electrical breakdown strength, coercive force and electromechanical coupling coefficient along with high mechanical quality factor. Therefore, the piezoelectric ceramics of Example Nos. 1,6,10 with high $k_p$, $Q_M$ and mechanical bending

TABLE 1

| Example No. | Mol percent of composition: PbO | $MnO_2$ | $Nb_2O_5$ | $Li_2O$ | $TiO_2$ | $ZrO_2$ | $Nb_2O_5$/$Li_2O$ ratio | Planar coupling coeff. (kp) | Mechanical quality factor ($Q_M$) | Mechanical bending strength (kg/cm$^2$) | Electrical breakdown strength (kV/mn) | Coercive force (kV/cm) |
|---|---|---|---|---|---|---|---|---|---|---|---|---|
| 1 | 51.2 | 1.0 | 2.4 | 0.7 | 22.2 | 22.5 | 3.4285 | 0.62 | 2232 | 1350 | 19.6 | 24.6 |
| 2 | 55.0 | 0.2 | 7.0 | 2.5 | 16.2 | 19.1 | 2.8000 | .42 | 2350 | 1320 | 19.4 | 20.1 |
| 3 | 54.3 | 1.0 | 7.3 | 2.2 | 19.0 | 16.2 | 3.3181 | .45 | 2140 | 1390 | 19.8 | 23.7 |
| 4 | 53.0 | 1.0 | 7.0 | 3.8 | 17.7 | 17.5 | 1.8421 | .53 | 2090 | 1330 | 19.5 | 24.2 |
| 5 | 50.5 | 0.4 | 0.8 | 0.2 | 24.8 | 23.3 | 4.0000 | .61 | 2180 | 1340 | 20.0 | 25.1 |
| 6 | 50.1 | .5 | .2 | .1 | 22.7 | 26.4 | 2.0000 | .64 | 2070 | 1320 | 19.6 | 19.8 |
| 7 | 50.1 | 9.3 | 6.3 | 2.2 | 14.8 | 17.3 | 2.8636 | .40 | 2530 | 1370 | 19.8 | 21.2 |
| 8 | 54.5 | 4.7 | 6.6 | 2.1 | 17.3 | 14.8 | 3.1428 | .43 | 2360 | 1330 | 19.5 | 22.0 |
| 9 | 50.5 | 0.2 | 0.8 | 0.4 | 21.3 | 16.8 | 2.0000 | .62 | 2080 | 1320 | 19.4 | 20.3 |
| 10 | 50.3 | .9 | 1.3 | .4 | 23.1 | 24.0 | 3.2500 | .63 | 2120 | 1350 | 19.7 | 20.6 |

TABLE 2

| Example No. | Mol percent of composition PbO | MnO$_2$ | Nb$_2$O$_5$ | Li$_2$O | TiO$_2$ | ZrO$_2$ | Planar coupling coeff. (kp) | Mechanical quality factor ($Q_M$) | Mechanical bending strength (kg/cm$^2$) | Electrical breakdown strength (kV/mm) | Coercive force (kV/cm) |
|---|---|---|---|---|---|---|---|---|---|---|---|
| 11 | 56.1 | 1.0 | 10.4 | 3.9 | 13.9 | 14.7 | 0.21 | 1860 | 1300 | 18.5 | 16.5 |
| 12 | 44.8 | 9.5 | 6.1 | 1.8 | 12.4 | 25.4 | .23 | 1540 | 1120 | 17.2 | 18.6 |
| 13 | 50.0 | | 0.16 | 0.04 | 19.8 | 30.0 | .42 | 110 | 1060 | 11.2 | 15.9 |
| 14 | 49.7 | | .7 | | 23.3 | 26.3 | .54 | 80 | 890 | 10.5 | 13.5 |
| 15 | 50.0 | | | | 23.5 | 26.5 | .47 | 100 | 850 | 10.6 | 14.0 |

strength are suitable for use in the element of ultrasonic devices such as sonar projector, ultrasonic cleaner and piezoelectric ceramic transformer. Also in addition to above characteristic properties, the piezoelectric ceramics having high stability in resonant frequency with temperature are suitable for use in various ceramic filter used in various wireless communication equipments, resonator and oscillator applicatuons. The temperature change in resonant frequency within the range −20° to 70°C is low (less than ± 0.2 percent) with the composition Example Nos. 3,7,8. These ceramics are desirable for use in filter, resonator and oscillator element. According to Table 1, the values of planar coupling coefficient and mechanical quality factor can be adjusted to suit various applications by appropriately selecting the composition.

Curie temperature of typical sample of Example Nos. 1 and 10 are 320°C and 350°C, respectively. These data indicate that the piezoelectric ceramic compositions according to present invention are expected to have a high potential as electromechanical transducers up to relatively high temperature.

Table 2 shows the piezoelectric planar coupling coefficient, mechanical quality factor, mechanical bending strength, electrical breakdown strength and coercive force of the ceramic composition out of the scope of the system according to the present invention. It will be seen from Table 2 that the ceramic compositions out of the scope of present invention, e.g., Example Nos. 11 to 12 show a low electromechanical planar coupling coefficient, low mechanical quality factor and low electrical braeakdown strength and a large temperature change in resonant frequency. Also, it will be apparent from Table 2 that the ceramic compositions e.g., Examples Nos. 13 and 14 which are lacking one component of $MnO_2$ or two components of $MnO_2$ and $Li_2O$ from the composition according to the present invention, show a poor piezoelectric properties and mechanical strength. Further, it will be clear from Table 2 that the ceramic compositions, e.g., Examples No. 15 which is well known as usual lead titanate-lead zirconate is no match for the composition according to the present invention.

From Table 1 and 2, it will be readily evident that the superior piezoelectric ceramic compositions can be obtained only from the six components within the scope of the present invention system.

In addition to the superior properties shown above, the compositions according to the present invention yield ceramics of good physical quality and which polarize well. It will be understoos from the foregoing that the solid solution ceramics $u$ $PbO$-$v$ $MnO_2$-$w$ $Nb_2O_5$-$x$ $Li_2O$-$y$ $TiO_2$-$z$ $ZrO_2$ form an excellent piezoelectric ceramic body.

It will be evident that the starting materials to be used in this invention are not limited to those used in the above examples. Those oxides, hydroxides and carbonates may be used instead of any starting material of above examples, which are easily decomposed to form required compositions at elevated temperature.

What we claim is:

1. A piezoelectric ceramic composition consisting essentially of a solid solution of a material selected from the system $uPbO$-$vMnO_2$-$wNb_2O_5$-$xLi_2O$-$yTiO_2$-$zZrO_2$, wherein subscripts $u$, $v$, $w$, $x$, $y$ and $z$ respectively have a following mol percent, $u$=55.0 to 50.1, $v$=9.3 to 0.2, $w$=7.3 to 0.2, $x$=3.8 to 0.1, $y$=24.8 to 14.8 and $z$=26.8 to 14.8, $u+v+w+x+y+z=100$, and the $Nb_2O_5/Li_2O$ mol ratio is a value selected from the range $4.0000 \geqq Nb_2O_5/Li_2O \geqq 3.1428$ and $2.8636 \geqq Nb_2O_5/Li_2O \geqq 1.8421$.

2. A piezoelectric ceramic material according to claim 2 consisting of the solid solution having the following mol percent composition: PbO 53.0, $MnO_2$ 1.0, $Nb_2O_5$ 7.0, $Li_2O$ 3.8, $TiO_2$ 17.7 and $ZrO_2$ 17.5.

3. A piezoelectric ceramic material according to claim 1, consisting of the solid solution having the following mol percent composition: PbO 50.0, $MnO_2$ 9.3, $Nb_2O_5$ 6.3, $Li_2O$ 2.2, $TiO_2$ 14.8 and $ZrO_2$ 17.3.

4. A piezoelectric ceramic material according to claim 1, consisting of the solid solution having the following mol percent composition: PbO 50.5, $MnO_2$ 0.4, $Nb_2O_5$ 0.8, $Li_2O$ 0.2, $TiO_2$ 24.8 and $ZrO_2$ 23.3.

5. A piezoelectric ceramic material according to claim 1, consisting of the solid solution having the following mol percent composition: PbO 55.0, $MnO_2$ 0.2, $Nb_2O_5$ 7.0, $Li_2O$ 2.5, $TiO_2$ 16.2 and $ZrO_2$ 19.1.

6. A piezoelectric ceramic material according to claim 1, consisting of the solid solution having the following mol percent composition: PbO 50.5, $MnO_2$ 0.2, $Nb_2O_5$ 0.8, $Li_2O$ 0.4, $TiO_2$ 21.3 and $ZrO_2$ 26.8.

7. A piezoelectric ceramic material according to claim 1 consisting of the solid solution having the following mol percent composition: PbO 51.2, $MnO_2$ 1.0, $Nb_2O_5$ 2.4, $Li_2O$ 0.7, $TiO_2$ 22.2 and $ZrO_2$ 22.5.

8. A piezoelectric ceramic material according to claim 1 consisting of the solid solution having the following mol percent composition: PbO 50.1, $MnO_2$ 0.5, $Nb_2O_5$ 0.2, $Li_2O$ 0.1, $TiO_2$ 22.7 and $ZrO_2$ 26.4.

9. A piezoelectric ceramic material ccording to claim 1 consisting of the solid solution having the following mol percent composition: PbO 50.3, $MnO_2$ 0.9, $Nb_2O_5$ 1.3, $Li_2O$ 0.4, $TiO_2$ 23.1 and $ZrO_2$ 24.0.

10. A piezoelectric ceramic material according to claim 1 consisting of the solid solution having the following mol percent composition: PbO 54.3, $MnO_2$ 1.0, $Nb_2O_5$ 7.3, $Li_2O$ 2.2, $TiO_2$ 19.0 and $ZrO_2$ 16.2.

11. A piezoelectric ceramic material according to claim 1 consisting of the solid solution having the following mol percent composition: PbO 54.5, $MnO_2$ 4.7, $Nb_2O_5$ $_{40}$ 6.6, $_2$O 2.1, $TiO_2$ 17.3 and $ZrO_2$ 14.8.

* * * * *